United States Patent [19]

Pollard

[11] Patent Number: 5,091,709
[45] Date of Patent: Feb. 25, 1992

[54] ELECTRICALLY SHORT AIR LINE FOR NETWORK ANALYZER CALIBRATION

[75] Inventor: Roger D. Pollard, Leeds, United Kingdom

[73] Assignee: Hewlett-Packard Company, Palo Alto, Calif.

[21] Appl. No.: 312,322

[22] Filed: Feb. 15, 1989

Related U.S. Application Data

[62] Division of Ser. No. 99,434, Sep. 21, 1987, Pat. No. 4,845,423.

[51] Int. Cl.⁵ .......................... H01P 3/06; H01P 3/12
[52] U.S. Cl. ................................ 333/239; 333/243; 333/254; 333/260
[58] Field of Search ............... 333/239, 243, 245, 248, 333/254, 260

[56] References Cited

U.S. PATENT DOCUMENTS

| | | | |
|---|---|---|---|
| 2,434,509 | 1/1948 | Okress | 333/260 |
| 2,490,622 | 12/1949 | Cork | 333/260 X |
| 3,560,029 | 2/1971 | Floyd, Jr. | 333/254 X |
| 3,731,160 | 5/1973 | Klein | 333/243 X |
| 4,932,673 | 6/1990 | Domnikov et al. | 333/254 X |

*Primary Examiner*—Paul Gensler
*Attorney, Agent, or Firm*—William C. Milks, III

[57] ABSTRACT

A precision transmission line in the form of a short air line is disclosed. The short air line is approximately one-quarter wavelength at the middle frequency of the measurement frequency range. One embodiment comprises a very short coaxial air line. The inner conductor is threaded onto a mating inner conductor, such as the inner conductor of the network analyzer test port. For reliable interface at the other end of the inner conductor, a precision coaxial connector is preferably provided for connection to a device under test. The outer conductor is then attached coaxially to the inner conductor between the network analyzer test port and the device under test. Another embodiment comprises a waveguide for calibrations at higher measurement frequencies. In the case of the waveguide, locating structure is provided for properly orienting the waveguide with respect to the network analyzer test port and the device under test. The electrically short air line provides a very precise element for use in the offset-load, as well as other, calibrations of network analyzers.

16 Claims, 5 Drawing Sheets

ELECTRICALLY SHORT AIR LINE FOR NETWORK ANALYZER CALIBRATION

This application is a divisional of application Ser. No. 099,434, filed Sept. 21, 1987, now U.S. Pat. No. 4,845,423, issued on July 4, 1989

Cross Reference to Related Application

BACKGROUND OF THE INVENTION

This invention relates to network analyzers employed for electrical circuit measurements and, more particularly, to calibration techniques for network analyzers. Specifically, the invention provides a novel configuration for a transmission line element employed in calibrating a network analyzer used for measurements in the microwave and millimeter-wave range, and a novel method for using the transmission line element in calibrating the analyzer.

Network analyzers are universally used for determining response characteristics of various devices under test, such as filter circuits (or more complex electrical circuits), in order to characterize the device or test it to assure that it meets specifications. The devices under test are either one-port or two-port circuits The accuracy of a network analyzer depends not only upon the design of the analyzer, but also upon calibration of the analyzer.

Accordingly, various one-port and two-port techniques have been developed for calibrating network analyzers. Known calibration techniques vary in complexity and accuracy.

Typically, these calibration techniques have involved the use of open-, short-, and load-circuit electrical measurements In traditional one-port calibration techniques, the test port of the network analyzer is open-circuited, and a measurement is taken. This process is repeated with the test port short-circuited, and finally with an impedance-matched load connected across the test port. These measurements are then utilized to calibrate the network analyzer. In traditional two-port calibration techniques, these same measurements are taken for each test port of the network analyzer individually, and, additionally, another measurement is taken by connecting the two test ports together to measure the transmission. Often, these techniques employ sliding loads and/or transmission lines that have lengths that are long relative to the wavelengths at the measurement frequencies of interest.

When a length of transmission line is used in connection with the calibration technique, the electrical measurement depends upon the mechanical accuracy of the transmission line. The challenge is therefore how to construct a transmission line having a fixed characteristic impedance when inserted into a network analyzer measurement configuration between the test port or ports of the analyzer, on the one hand, and a load or short, on the other hand This characteristic impedance should be accurately known to many decimal places.

However, problems have arisen with the connection of the inner conductor of known transmission lines. Heretofore, contact between the inner conductors of the transmission line and the network analyzer test port, or load or short, has been effected by collets or a pin-in-socket connection.

One known transmission line, available from various manufacturers, comprises an inner conductor rod having recesses formed in the ends. A collet, such as an APC-7 (trademark of Amphenol Corporation) snowflake, is inserted into the recess at each end of the conductor rod. The inner conductor is supported by insulators typically disposed near the ends of the conductor rod in the interstitial space between the rod and the barrel of the surrounding coaxial outer conductor. Unfortunately, the insulators adversely affect performance. Also, connections are not highly repeatable due to the variable compliance of the collets when the conductor rod is interfaced with similar collets associated with the mating inner conductors of the network analyzer test port and load or short.

Another known transmission line, for example, included in the Model Number HP 11637A calibration kit, available from Hewlett-Packard Company of Palo Alto, Calif., comprises an inner conductor rod which is not supported by insulators. The rod is shorter than the outer conductor, and also shorter than the distance to be spanned by the inner conductor A pin is formed at each end of the rod and extends outwardly away from the rod end into contact with a socket provided in the mating inner conductor of the network analyzer test port or load or short, as the case may be, opposite the rod end. The outer conductor surrounds the inner conductor and is typically provided with a threaded collar for engagement with a threaded sleeve extending from the test port or load or short. Unfortunately, the rod can be radially offset from the centerline of the structure to which the transmission line is connected, the conductor rod can be longitudinally shifted with respect to the outer conductor, or the inner conductor can bow.

An improved pin-in-socket connection is found in the Model Number 2653, available from Maury Microwave Corporation of Cucamonga, Calif., in which contact between the inner conductors is effected by a spring mechanism. The ends of the rod are provided with recesses. A spring-loaded pin resides in the recess at each end of the rod and is biased outwardly away from the rod end into contact with a socket provided in the mating inner conductor of the network analyzer test port or load or short opposite the rod end. Additionally, the inner conductor rod has conical ends, and countersinks are provided in the mating inner conductors of the network analyzer test port, load, or short to aid in aligning the inner conductors, but axial shift and bowing problems persist.

These misalignment problems and asymmetries result in irreproducibility of connections required for accurate network analyzer calibration. Therefore, it is desirable to provide a more accurate and repeatable connection between the inner conductors.

SUMMARY OF THE INVENTION

The present invention provides a precision transmission line in the form of a short air line. A method for calibration of a network analyzer using the short air line is also disclosed.

The transmission line in accordance with the invention is a short air line which is approximately one-quarter wavelength at the middle frequency of the measurement frequency range. One embodiment of the invention provides a very short coaxial air line. The inner and outer conductors are separate. The inner conductor is threadedly connected to a mating inner conductor, such as the inner conductor of the network analyzer test port. For reliable interface at the other end of the inner conductor, a precision coaxial connector is preferably provided for connection to the inner conductor of a device under test. The outer conductor of the short air line is then attached coaxially to the inner conductor between the network analyzer test port and the device under test. The lengths of the inner and outer conductors of the short coaxial air line are identical. Moreover, because the inner and outer conductors are the identical length and the coaxial air line is short, for example, 7 mm, the inner conductor is not bowed Also, the inner conductor is properly centered Additionally, another embodiment of the invention provides a very short precise length of transmission line in the form of a waveguide for calibrations at higher measurement frequencies. In the case of the waveguide, locating means is provided for properly orienting the waveguide with respect to the network analyzer test port and the device under test. The electrically short air line in accordance with the invention provides a very precise element for use in calibrations of network analyzers.

A one-port calibration method for enhancement of the accuracy of a network analyzer using the short air line is also disclosed. An offset-load calibration comprises the following measurements: (a) a fixed load (stable, but not necessarily any better than 30 dB return loss); (b) the short air line terminated with the same load; (c) a short circuit; and, (d) the short air line terminated with the same short circuit.

There is also a wide range of other calibration applications of the short air line. The short air line can be used in connection with both traditional one-port and two-port network analyzer calibrations. The short air line improves the accuracy with which a network analyzer can be calibrated, especially in the case of a Thru-Reflect-Line (TRL) calibration, which requires a single precision transmission line (in addition to a single unknown reflecting termination). This in turn provides a method for assessment of the residual errors in a network analyzer measurement and verification of performance of such a network analyzer.

BRIEF DESCRIPTION OF THE DRAWINGS

The above and other features of the present invention and the concomitant advantages will be better understood and appreciated by those skilled in the art in view of the detailed description given below in conjunction with the accompanying drawings. In the drawings.

DESCRIPTION OF THE PREFERRED EMBODIMENTS

One aspect of the present invention relates to the design and characterization of an electrically short microwave or millimeter-wave transmission line element.

The element is a short length of precision transmission line in the form of an air line which provides a phase shift that is not close to a multiple of 180 degrees over the measurement frequency range of interest. This short air line is constructed with a high degree of precision, and then its mechanical dimensions are measured to a high degree of accuracy. These measurements and the known loss of the short air line can then be used to calculate the scattering parameters of the line section. This enables calibration of a network analyzer.

The technique for constructing a short air line depends upon the transmission medium. Let Phi be the one way phase shift through an air line at some frequency, F. Thus, $$\text{Phi} = (\text{Beta})(L) = \frac{2\text{Pi}(L)}{\text{Lambda}},$$

where L is the length of the air line, and Lambda is the wavelength at the given frequency. Now, since Lambda = c/F, where c is the speed of light ($3 \times 10^{10}$ cm/s), substituting into the above equation, $$\text{Phi} = 2(\text{Pi})(F)(L)/c \text{ radians}.$$

Therefore, since one radian equals 360/(2Pi) degrees, $$\begin{aligned} \text{Phi} &= 360(F)(L)/c \\ &= \frac{360(f \times 10^9)(L)}{3 \times 10^{10}} \\ &= 12 fL \text{ degrees} \end{aligned}$$

where f is the frequency in GHz, and L is the length of the transmission line in cm.

At midband (i.e., $f = f_{mid} = (f_{max} + f_{min})/2$), Phi is 90 degrees (Phi must still equal less than 180 degrees at $f_{max}$.) Accordingly, the length of the short air line that is required is calculated as $$L_{mid} = 15/(f_{max} + f_{min}).$$

For example, approximately a 7 mm length is needed for a 2 GHz to 18 GHz frequency range in coaxial transmission line.

Figure 1:
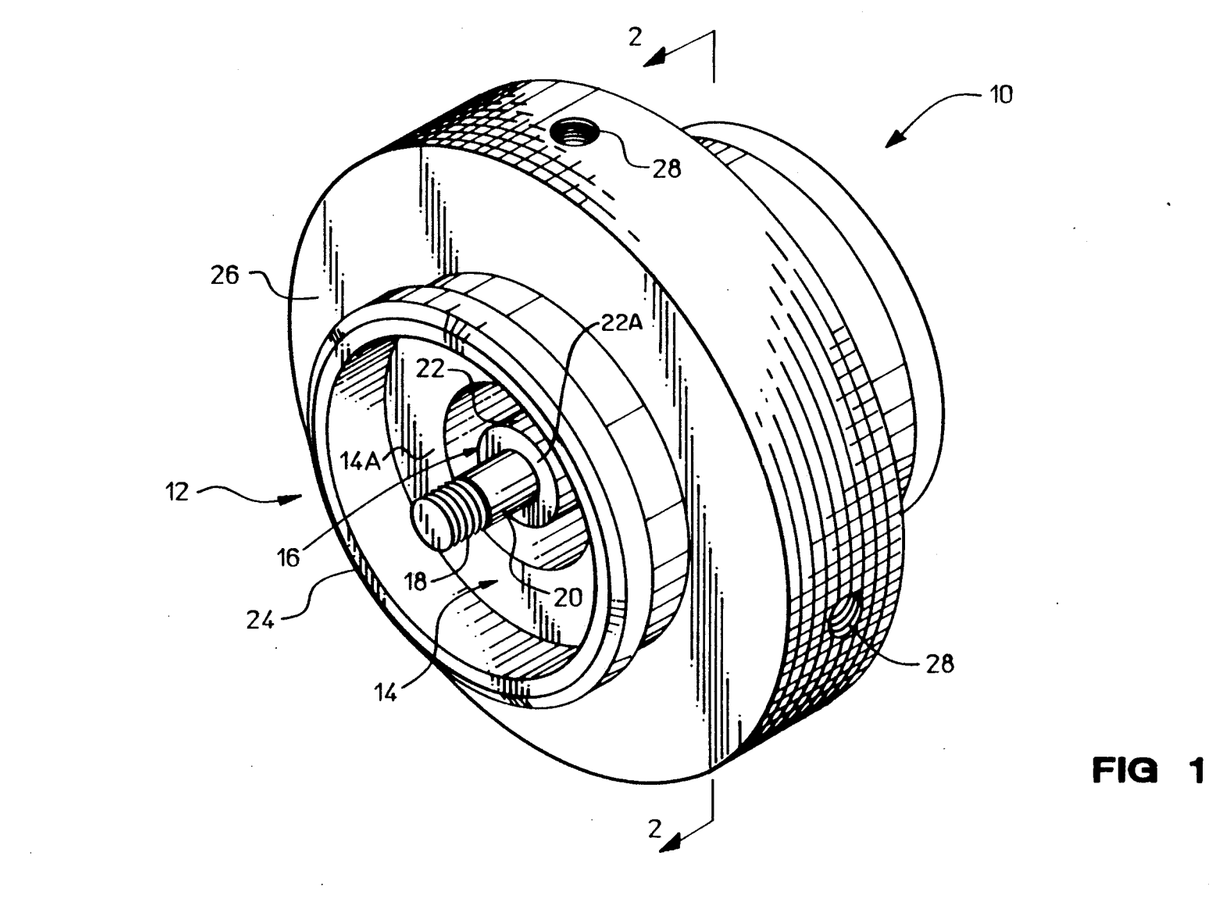
FIG. 1 shows a coaxial form of electrically short air line in accordance with one embodiment of the invention.
Figure 2:
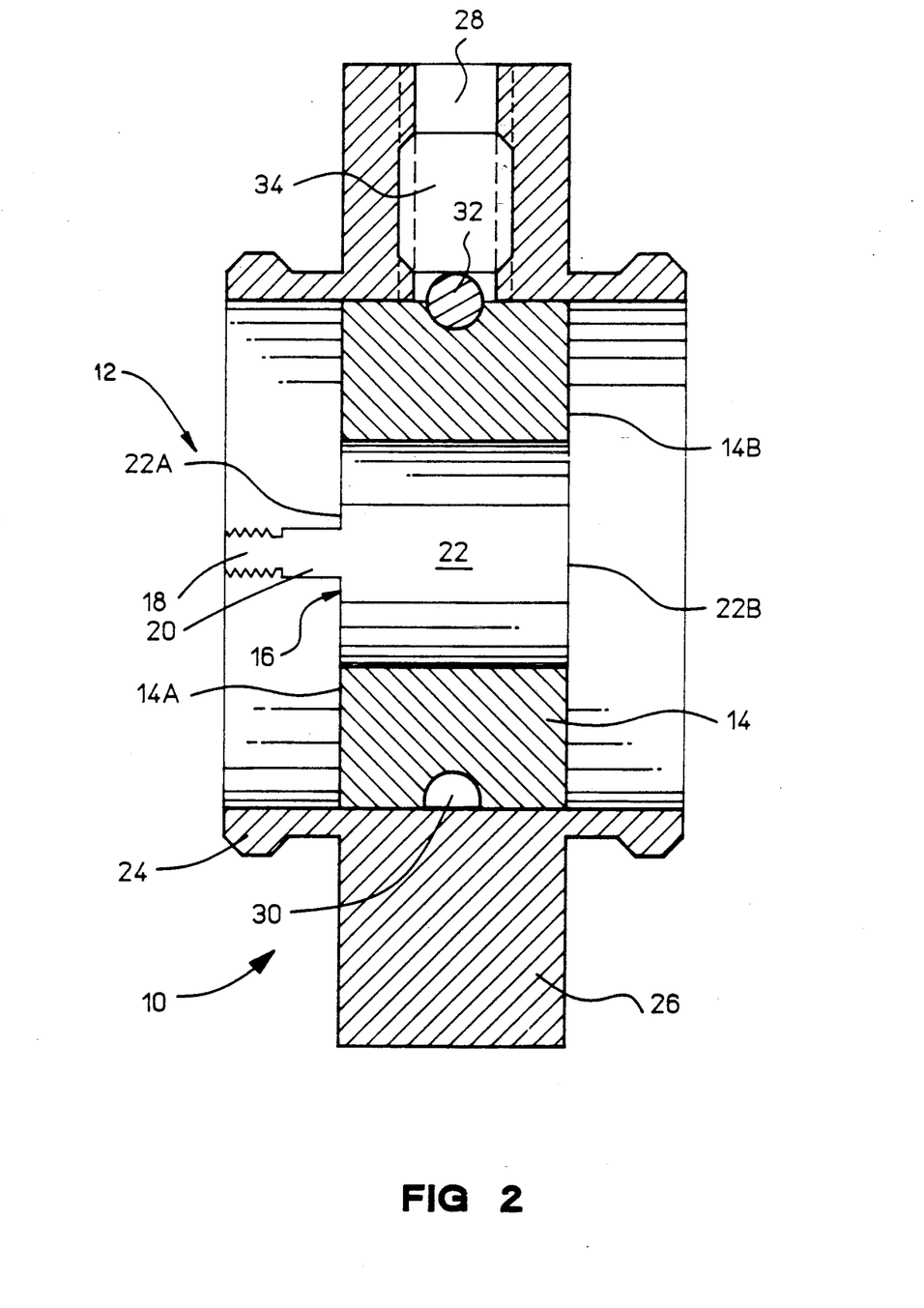
FIG. 2 is a cross-sectional view of the short coaxial air line taken along line 2—2 of FIG. 1.

The following are configurations for a short, precise length of transmission air line in accordance with the invention. In the microwave range, a short air line in accordance with the invention, generally indicated by the numeral 10, is in the form of a short coaxial air line 12, as shown in FIGS. 1 and 2. The short coaxial air line 12 has a length, for example, of 7 mm for use in the 2 GHz to 18 GHz measurement frequency range.

As shown in FIGS. 1 and 2, the short coaxial air line 12 comprises an outer conductor 14. The outer conductor 14 has two sides 14A and 14B, both of which are ground flat and parallel to give the desired length. The outer conductor 14 is preferably constructed from a cylinder of gold-plated beryllium copper alloy, which is bored, reamed, and honed to provide a precise inside diameter.

The short coaxial air line 12 also comprises an inner conductor 16. The inner conductor 16 has a body 22. The body 22 is connected at an end 22A to a neck 20 in turn connected to a threaded head 18, and the body 22 is ground flat at an end 22B opposite the end 22A. The inner conductor 16 is preferably constructed from a section of centerless ground gold-plated beryllium copper alloy of appropriate diameter.

Using a fixture which has a flat surface for contact with the side 14A of the outer conductor 14 and a threaded hole for receiving the threaded head 18 and the neck 20 so that the end 22A of the inner conductor 16 also contacts the flat surface, the side 14B of the outer conductor and the end 22B of the inner conductor can be ground (lapped) so that the outer conductor and the body 22 of the inner conductor are precisely the same length.

The outer conductor 14 is preferably mounted in a threaded sleeve 24 which serves the role of a connector pair and allows connection of the outer conductor sandwiched between the test port of a network analyzer (not shown) and a load device (not shown). Preferably, the periphery of the sleeve 24 has a knurled annular flange 26 with at least one threaded hole 28. The periphery of the outer conductor 14 is preferably provided with a race 30. The outer conductor 14 is then inserted into the sleeve 24 so that the hole 28 is aligned with the race 30, and a ball bearing 32 is deposited through the hole into the race with a portion of the ball bearing remaining in the hole to form an interference connection between the outer conductor and the sleeve A set screw 34 is threaded into the hole 28 to hold the ball bearing 32 in place so that the outer conductor 14 does not slip longitudinally with respect to the sleeve 24.

Both the outer conductor 14 and the inner conductor 16 are accurately measured using laser micrometer (lengths and outer diameter) and air gauges (inner diameter). In one implementation of the short coaxial air line 12, prior to being lapped and gold-plated, the inside diameter of the outer conductor 14 is 7.000 plus or minus 0.0046 mm. The outside diameter of the body 22 of the inner conductor 16 is 3.0402 plus or minus 0.002 mm. Preferably, numerous parts are produced, and these parts are matched to within 6 microns, that is, the parts are matched so that the ratio of the outside diameter of the body 22 of the inner conductor 16 to the inside diameter of the outer conductor 14 is 2.30248 plus or minus 0.0003. The side 14B of the outer conductor 14 and the end 22B of the inner conductor 16 are next lapped, and then the inner and outer conductors are gold-plated After the outer conductor 14 and the inner conductor 16 are gold-plated with 0.635 to 0.889 mm of gold, the length of the outer conductor and the body 22 of the inner conductor is 6.95 plus or minus 0.015 mm. The delta value (i.e., the difference in length) between the outer conductor 14 and the body 22 of the inner conductor 16 is 0.00127 mm. Furthermore, the outside diameter of the neck 20 is 1.527 plus or minus 0.005 mm, and the neck has a plus or minus 0.01 mm concentricity with respect to the body 22. Also, the inside diameter of the threaded mating bore (not shown), for example, in the inner conductor of the network analyzer test port, is 1.537 plus 0.013 (minus zero) mm. Accordingly, this establishes a 0.025 mm concentricity between the inner conductor 16 and the mating inner conductor of the network analyzer test port, for example, as well as a plus or minus 0.033 mm concentricity with respect to the centerline or axis of the short coaxial air line 12. As a result, the calculated concentricity error is equivalent to better than an 88 dB return loss. This compares to a calculated best-case 76 dB equivalent return loss for the aforementioned Model Number 2653 transmission line available from Maury Microwave.

Preferably, the needed threaded bore is tapped in the inner conductor of the network analyzer test port to accommodate the threaded head 18. Also, a precision coaxial connector, such as an APC-7 (trademark of Amphenol Corporation) snowflake, (not shown) is connected to the inner conductor 16 at the end 22B of the body 22 to provide effective connection of the short coaxial air line 12, for example, to the load or short.

Figure 3:
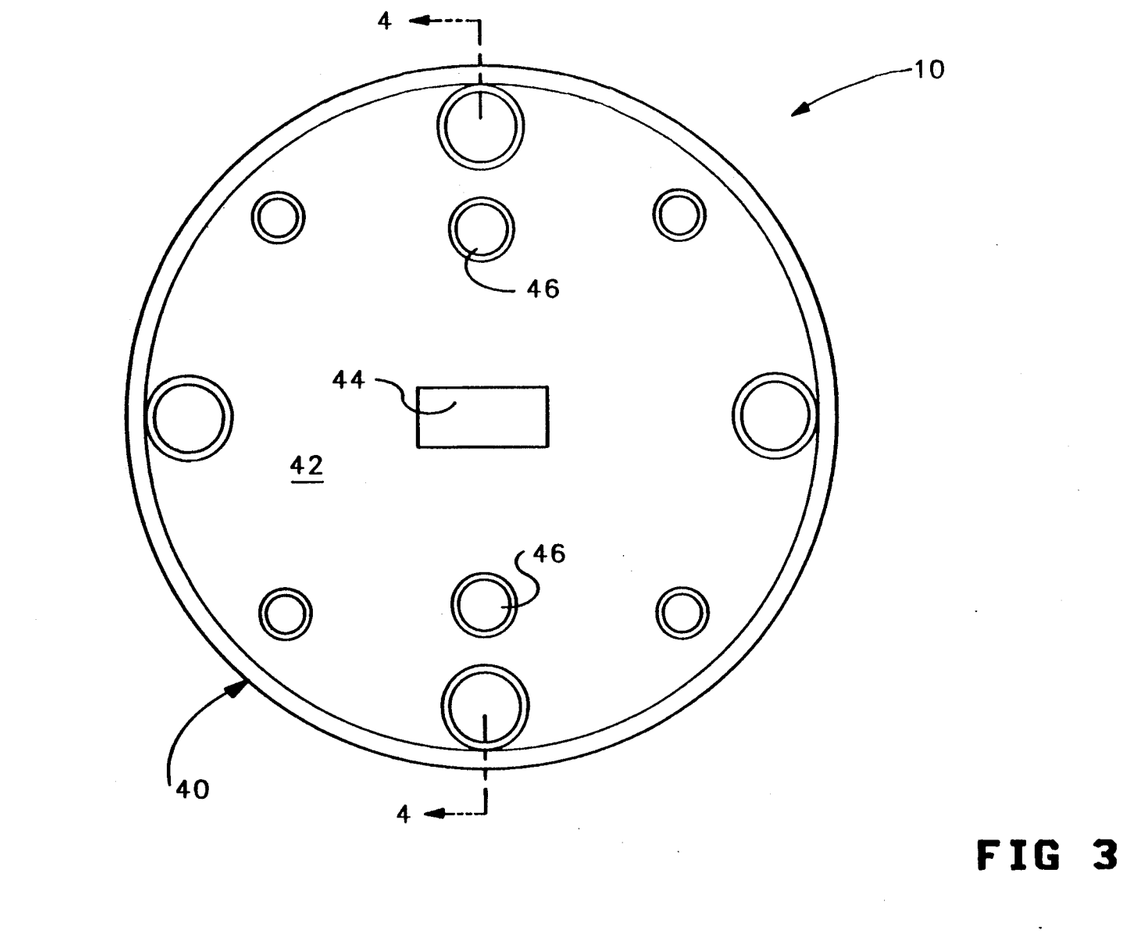
FIG. 3 is an elevational view of a waveguide form of electrically short air line in accordance with another embodiment of the invention.
Figure 4:
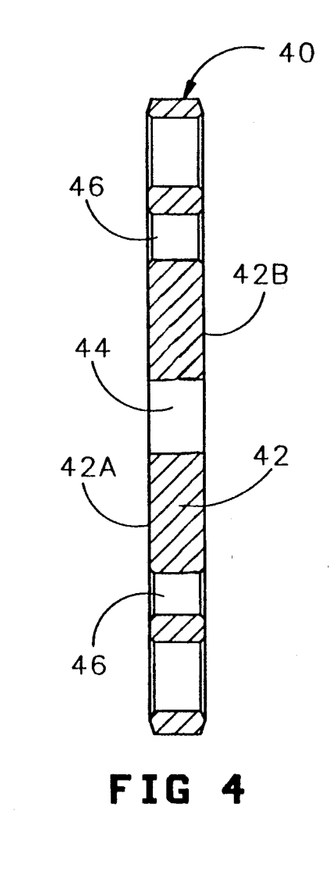
FIG. 4 is a cross-sectional view of the waveguide taken along line 4—4 of FIG. 3.

In another embodiment, the short air line 10 is in the form of a waveguide 40, as shown in FIGS. 3 and 4. The waveguide 40 comprises a thin waveguide shim 42 having a substantially rectangular aperture or waveguide opening 44 constructed by milling, reaming, and broaching or by electroforming or by wire electric discharge machining, or by other appropriate precision machining technique (in all cases taking care to ensure dimensional accuracy and that internal corner radii are minimized). The waveguide shim 42 has two sides 42A and 42B which are ground (lapped) flat so that the opposite sides are parallel, and all dimensions are measured accurately.

Precise location of the waveguide 40 is assured by a plurality of holes 46 for hardened dowel pins or other appropriate locating means (not shown) in the peripheral flange adjacent to the center of the long dimension (width) of the waveguide opening 4. The hardened dowel pins extend through the holes 46 into mating holes (not shown) in the network analyzer test port (not shown) and load or short (not shown) for properly orienting the waveguide 40.

In one implementation, the waveguide 40 is used in the Q band. After being gold-plated, the waveguide shim 42 has a diameter of approximately 28.58 mm. The long dimension of the waveguide opening 44 (width) is 5.691 plus or minus 0.006 mm, and the short dimension (height) is 2.846 plus or minus 0.006 mm. The corners of the waveguide opening 44 have a maximum radius of 0.025 mm. The holes 46 have a diameter of 2.380 plus 0.016 (minus zero) mm. This results in a calculated concentricity error that is equivalent to better than a 70 dB return loss. This is 20 dB better than the calculated equivalent return loss for known off-the-shelf waveguide components.

Figure 5A:
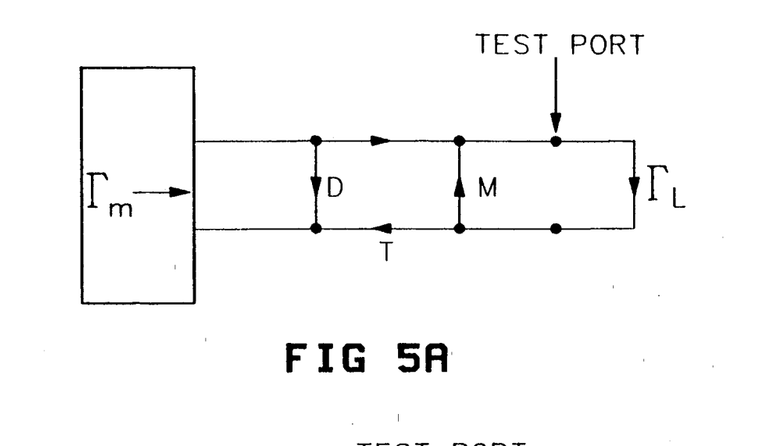
FIGS. 5A and 5B are flowgraphs of a network analyzer measurement system employing a precision electrically short air line in accordance with the invention.
Figure 5B:
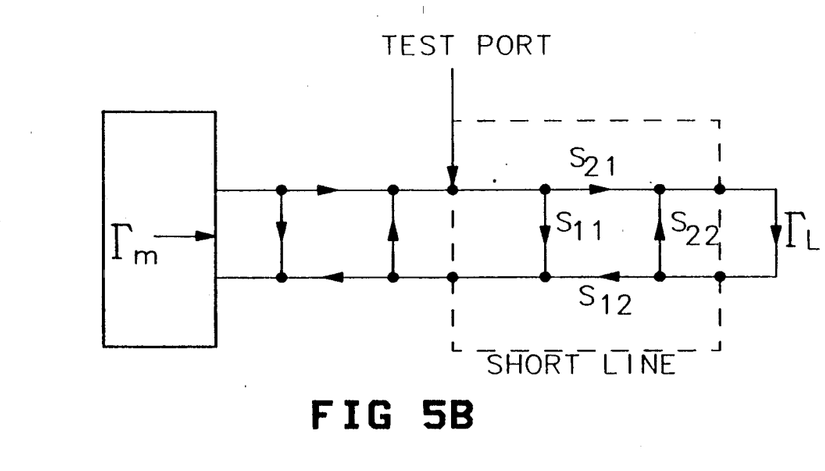

The invention further provides a one-port calibration method using the short air line and an appropriate accompanying theory for enhancement of the accuracy of a network analyzer The schematic for the measurement process in accordance with the offset-load calibration method of the invention appears in the flowgraphs shown in FIGS. 5A and 5B.

The calibration technique requires making measurements of a series of known devices, such as a load and a short, per se. and then through a length of the short transmission air line. The above mentioned mechanical measurements of the short air line and the known loss of the line are used to calculate the scattering parameters ($S_{ij}$) of the line section.

Figure 6:
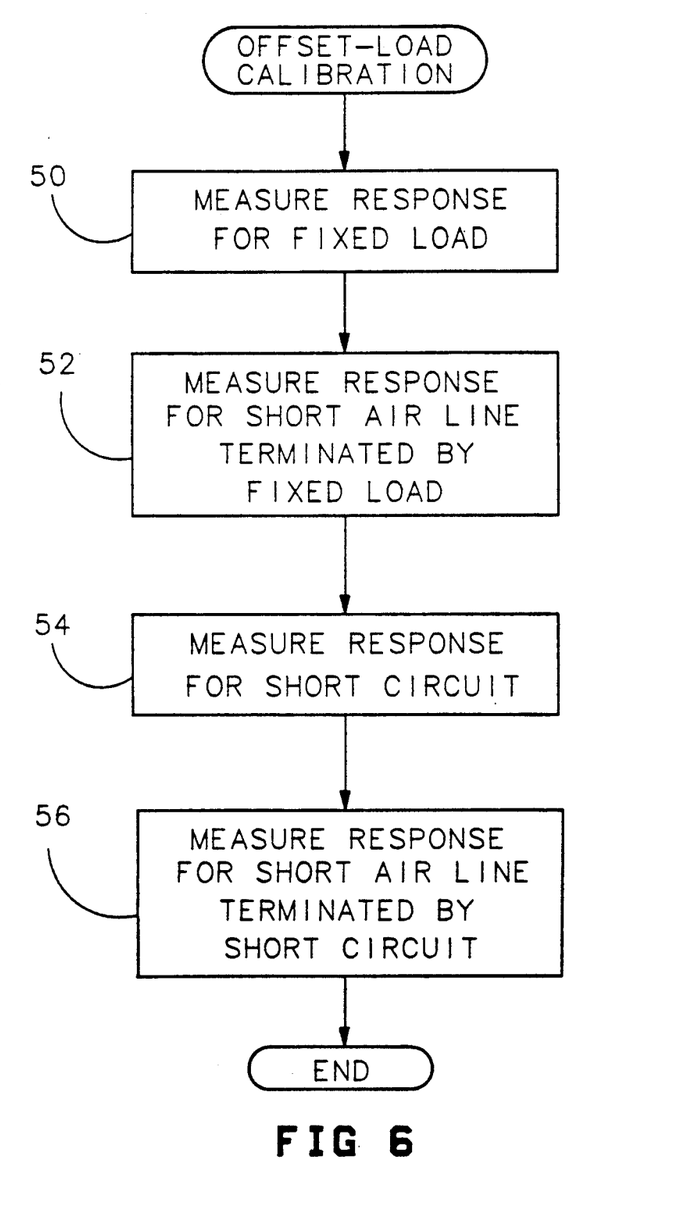
FIG. 6 is a flowchart of the one-port offset-load calibration method in accordance with the invention.

The measurements required are:

(a) a fixed load (stable, but not necessarily any better than 30 dB return loss) The results of this measurement are indicated by the numeral 50 in FIG. 6 and designated "Gamma$_1$" for convenience.

(b) the short air line terminated with the same load as in measurement (a). This measurement is indicated by the numeral 52 in FIG. 6 and can be referred to as "Gamma$_d$".

(c) a short circuit, as indicated by the numeral 54 in FIG. 6. "Gamma$_s$" can be used to identify the results of this measurement.

And, (d) the short air line terminated with the same short circuit as in measurement (c), as indicated by the numeral 56 in FIG. 6. "Gamma$_s$'" can be used to denominate this measurement.

The quantities designated D, M, and T which appear in FIG. 5A and the equations below can be shown to represent the systematic errors in the network analyzer. Thus, $$D = \frac{\text{Gamma}_d - \text{Gamma}_l S_{21} S_{12}}{1 - S_{12} S_{21}} - \frac{T S_{11}}{1 - S_{12} S_{21}},$$

$$M = \frac{\text{Gamma}_s' - \text{Gamma}_s \text{Gamma}'}{\text{Gamma}'(\text{Gamma}_s' - \text{Gamma}_s)}, \text{ and}$$

$$T = -\text{Gamma}_s(1 + M),$$

where $\text{Gamma}' = S_{11} - \frac{S_{21} S_{12}}{1 + S_{22}}$, and $S_{11}$, $S_{12}$, $S_{21}$, and $S_{22}$ are the scattering parameters of the short air line taking into account losses, the true (complex) characteristic impedance, and discontinuity susceptances arising from connection to an ideal (nominal dimensions) transmission line The unknown to be measured is then connected instead of Gamma$_L$ and measured as Gamma$_m$ where $$\text{Gamma}_m = D + \frac{T \text{Gamma}_L}{1 - M \text{Gamma}_L}$$

The invention thus provides a method (calibration technique) for enhancement of the accuracy of a network analyzer using a single specially constructed transmission line element and an appropriate accompanying theory. The principal advantage of the calibration method in accordance with the invention over previous calibration techniques is that only a single precision transmission line element is needed.

Additionally, several of the known calibration techniques, including Thru-Reflect-Line (TRL) and Thru-Short-Delay (TSD), are described in Engen, G. F., and Hoer, C. A., "'Thru-Reflect-Line': An Improved Technique for Calibrating the Dual Six-Port Automatic Network Analyzer," I.E.E.E. Trans Microwave Theory Tech., Vol. MTT-27, No. 12, December, 1979, pp. 987-993. The short air line in accordance with the invention applies to these as well as other calibration techniques. Preferably, a TRL calibration employing the short air line is used in the case of a two-port calibration. For example, the TRL calibration technique is a two-port calibration technique which by way of improvement would involve the following measurements: taking a measurement with a high-reflection termination, such as a short, connected directly across each test port of the network analyzer; taking a measurement with the short air line interposed between the test ports; and taking a measurement with the two test ports connected together.

Various embodiments of the precision electrically short air line in accordance with the invention have been described Also, an offset-load method in accordance with the invention for one-port calibration of a network analyzer using the short air line has been described. Modifications will be obvious to persons skilled in the art that are within the spirit of this invention. For example, in the case of the short coaxial air line 12, the needed threaded bore can be tapped in the inner conductor of the short and/or load to accommodate the threaded head 18, instead of in the inner conductor of the network analyzer test port. In order to appreciate the true scope of this invention, reference must therefore be made to the appended claims.

What is claimed is:

1. A precision transmission line in the form of a short air line connectable between a network analyzer test port and a device under test, the short air line comprising:

a short coaxial air line, the short air line being approximately one-quarter wavelength at a middle frequency of a given measurement frequency range, the coaxial air line comprising:

an inner conductor connectable between an inner conductor of the network analyzer test port and a device under test, the inner conductor being threadedly connectable at a first end to a mating inner conductor of one of the inner conductors of the network analyzer test port and the device under test; and an outer conductor separate from the inner conductor of the short air line, the outer conductor being coaxially disposed to the inner conductor and connectable between the outer conductors of the network analyzer test port and the device under test, the interstitial region between the outer conductor and the inner conductor being devoid of any support for the inner conductor within the outer conductor;

wherein the lengths of the inner and outer conductors of the short coaxial air line are substantially identical.

2. The short air line according to claim 1, further comprising a precision coaxial connector connected to a second end of the inner conductor of the short air line and connectable to the other of the inner conductors of the network analyzer test port and the device under test for reliable interface at the second end of the short air line inner conductor.

3. The short air line according to claim 1, wherein the short air line provides a phase shift that is not close to a multiple of 180 degrees over the given measurement frequency range.

4. The short air line according to claim 1, wherein the given measurement frequency range is 2 GHz to 18 GHz.

5. The short air line according to claim 4, wherein the length of the short air line is approximately 7 mm.

6. The short air line according to claim 1, wherein the inner conductor comprises a body, the body being connected at a first end to a neck, the neck in turn being connected to a threaded head, and a second end opposite the first end which is ground flat and the outer conductor has a first side and a second side, the first and second sides being ground flat and parallel to provide a desired length for the outer conductor.

7. The short air line according to claim 6, further comprising a fixture having a flat surface for contact with the first side of the outer conductor and a threaded hole for receiving the threaded head and the neck of the inner conductor so that the first end of the inner conductor also contacts the flat surface, the second side of the outer conductor and the second end of the inner conductor being ground so that the outer conductor and the body of the inner conductor are substantially the same length.

8. The short air line according to claim 6 wherein the inner conductor is constructed from a section of centerless ground gold-plated beryllium copper alloy of appropriate outside diameter and the outer conductor is constructed from a cylinder of gold-plated beryllium copper alloy, which is bored, reamed, and honed to provide an appropriate inside diameter.

9. The short air line according to claim 1, further comprising a threaded sleeve, wherein the outer conductor is mounted in the threaded sleeve, the threaded sleeve serving the role of a connector pair to allow connection of the outer conductor sandwiched between the network analyzer test port and the device under test.

10. The short air line according to claim 9, wherein the threaded sleeve has a peripheral knurled annular flange with at least one threaded hole and the periphery of the outer conductor has a race, the outer conductor being inserted into the threaded sleeve so that the hole is aligned with the race, and further comprising a ball bearing deposited through the hole into the race with a portion of the ball bearing remaining in the hole to form an interference connection between the outer conductor and the threaded sleeve and a set screw threaded into the hole to hold the ball bearing in place so that the outer conductor does not slip longitudinally with respect to the threaded sleeve.

11. The short air line according to claim 8, wherein prior to being ground and gold-plated, the outside diameter of the body of the inner conductor is 3.0402±0.002 mm and the inside diameter of the outer conductor is 7.000±0.0046 mm, numerous inner and outer conductors being produced and matched to within 6 μm so that the ratio of the outside diameter of the body of the inner conductor to the inside diameter of the outer conductor is 2.30248±0.0003, the second end of the inner conductor and the second side of the outer conductor then being ground and the inner and outer conductors being gold-plated with 0.635 to 0.889 mm of gold so that after the inner and outer conductors are gold-plated, the lengths of the body of the inner conductor and the outer conductor are approximately 6.95±0.015 mm and any difference in length between the body of the inner conductor and the outer conductor is not greater than 0.00127 mm.

12. The short air line according to claim 6, wherein the outside diameter of the neck is 1.527±0.005 mm, the neck has a ±0.01 mm concentricity with respect to the body, the inside diameter of a threaded mating bore in an inner conductor of a network analyzer test port is 1.537 plus 0.013 (minus zero) mm so that the concentricity between the inner conductor and the mating inner conductor of the network-analyzer test port is 0.025 mm and concentricity with respect to an axis of the short air line is 0.033 mm such that the calculated concentricity error is equivalent to better than an 88 dB return loss.

13. A precision transmission line in the form of a short air line connectable between a network analyzer test port and a device under test, the short air line comprising:
a short waveguide, the waveguide being approximately one-quarter wavelength at a middle frequency of a given measurement frequency range, the waveguide comprising:
a shim having a substantially rectangular aperture surrounded by a peripheral flange portion, the aperture having a transverse center line, the waveguide being connectable between the network analyzer test port, and the device under test;
connecting means associated with the waveguide, network analyzer test port and device under test for interconnecting the waveguide with the network analyzer test port and the device under test, the connecting means comprising a plurality of fastener-receiving holes in the peripheral flange portion into which fasteners external to the shim are inserted to secure the waveguide to the network analyzer test port and the device under test, the fasteners and fastener-receiving holes having a first tolerance therebetween; and
locating means associated with the waveguide, network analyzer test port, and device under test for properly orienting the waveguide with respect to the network analyzer test port and the device under test, the locating means comprising two pin-receiving holes in the peripheral flange portion adjacent to the center of the long dimension of the aperture and aligned along the center line of the aperture into which pins external to the shim are inserted, the pins and the pin-receiving holes having a closer tolerance therebetween than the first tolerance, to precisely locate the waveguide.

14. The short air line according to claim 13 wherein the shim has two sides which are ground flat so that the sides are parallel.

15. The short air line according to claim 13 wherein the external pins comprise hardened dowel pins for extending through the pin-receiving holes into mating holes in the network analyzer test port and the device under test for properly orienting the short air line.

16. The short air line according to claim 13 wherein the short air line is configured for the Q band, the shim being gold-plated and having a diameter of approximately 28.58 mm, the long dimension of the aperture being 5.691±0.006 mm, the short dimension of the aperture being 2.846±0.006 mm, the corners of the aperture having a maximum radius of 0.025 mm, and the pin-receiving holes having a diameter of 2.380 plus 0.016 (minus zero) mm so that the calculated concentricity error is equivalent to better than a 70 dB return loss.

* * * * *